United States Patent [19]

Chen

[11] Patent Number: 4,897,564

[45] Date of Patent: Jan. 30, 1990

[54] BICMOS DRIVER CIRCUIT FOR HIGH DENSITY CMOS LOGIC CIRCUITS

[75] Inventor: Chih-Liang Chen, Briarcliff Manor, N.Y.

[73] Assignee: International Business Machines Corp., Armonk, N.Y.

[21] Appl. No.: 290,596

[22] Filed: Dec. 27, 1988

[51] Int. Cl.[4] ............... H03K 19/003; H03K 19/092; H03K 19/401; H03K 19/094

[52] U.S. Cl. ................... 307/446; 307/570; 307/475; 307/542; 307/544

[58] Field of Search ............... 307/446, 475, 450, 451, 307/570, 571, 279, 443, 542, 568, 558, 264, 544

[56] References Cited

U.S. PATENT DOCUMENTS

| | | | |
|---|---|---|---|
| 3,879,619 | 4/1975 | Pleshko | 307/255 X |
| 4,103,188 | 7/1978 | Morton | 307/255 X |
| 4,296,382 | 10/1981 | Hoover | 330/264 |
| 4,335,360 | 6/1982 | Hoover | 330/264 |
| 4,352,073 | 9/1982 | Leuthold | 330/264 |
| 4,678,943 | 7/1987 | Uragami et al. | 307/570 X |
| 4,682,054 | 7/1987 | McLaughlin | 307/570 X |
| 4,751,410 | 6/1988 | Tanizawa | 307/570 |
| 4,833,350 | 5/1989 | Frisch | 307/544 X |
| 4,837,462 | 6/1989 | Watanabe et al. | 307/446 |
| 4,839,540 | 6/1989 | Ueno | 307/446 X |
| 4,841,172 | 6/1989 | Ueno et al. | 307/446 X |

FOREIGN PATENT DOCUMENTS 0041084 3/1980 Japan ................... 330/264

Primary Examiner—Andrew J. James
Assistant Examiner—David R. Bertelson
Attorney, Agent, or Firm—Pollock, Vande Sande & Priddy

[57] ABSTRACT

BICMOS driver circuit for high density CMOS logic circuits. The BICMOS logic circuit generates a voltage swing comparable to the CMOS logic circuit voltage swing with improved delay and noise immunity characteristics. A pair of complementary bipolar transistors are connected to a CMOS logic network. The transistors have serially connected collectors forming an output node and emitters connected to opposite terminals of a bipolar voltage source. Two FET transistors are connected between the base of each bipolar transistor and a CMOS operating voltage source. The CMOS logic network will switch one or the other bipolar transistor on while the other bipolar transistor is held off by its connected FET transistor.

9 Claims, 2 Drawing Sheets

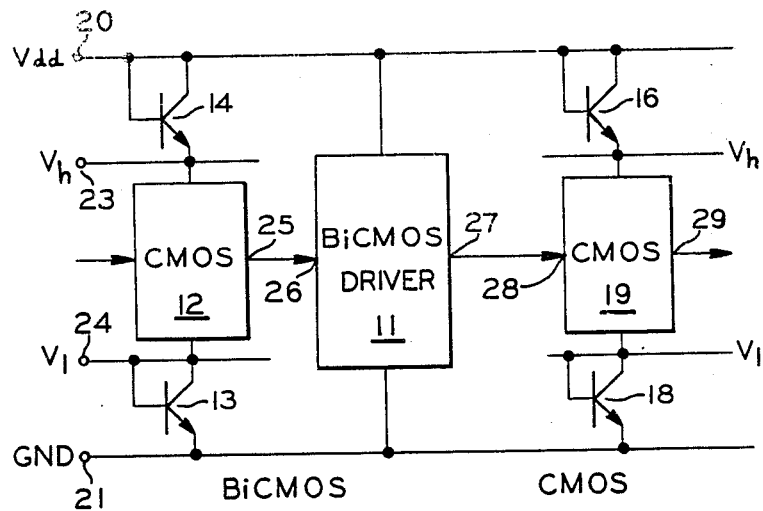
FIG. 1
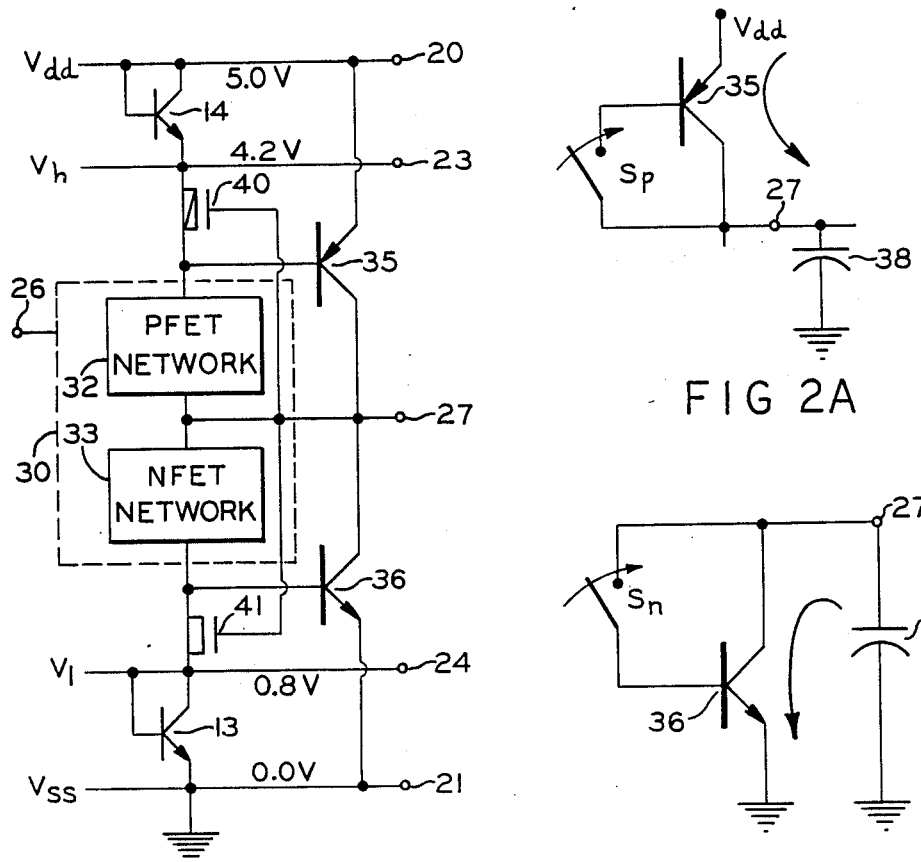
FIG. 2
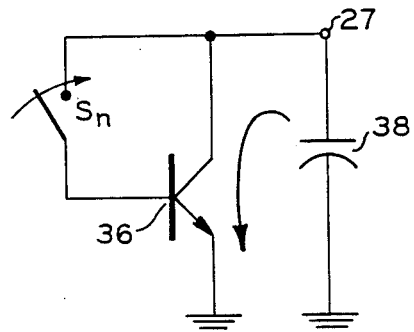
FIG. 2A
FIG. 2B

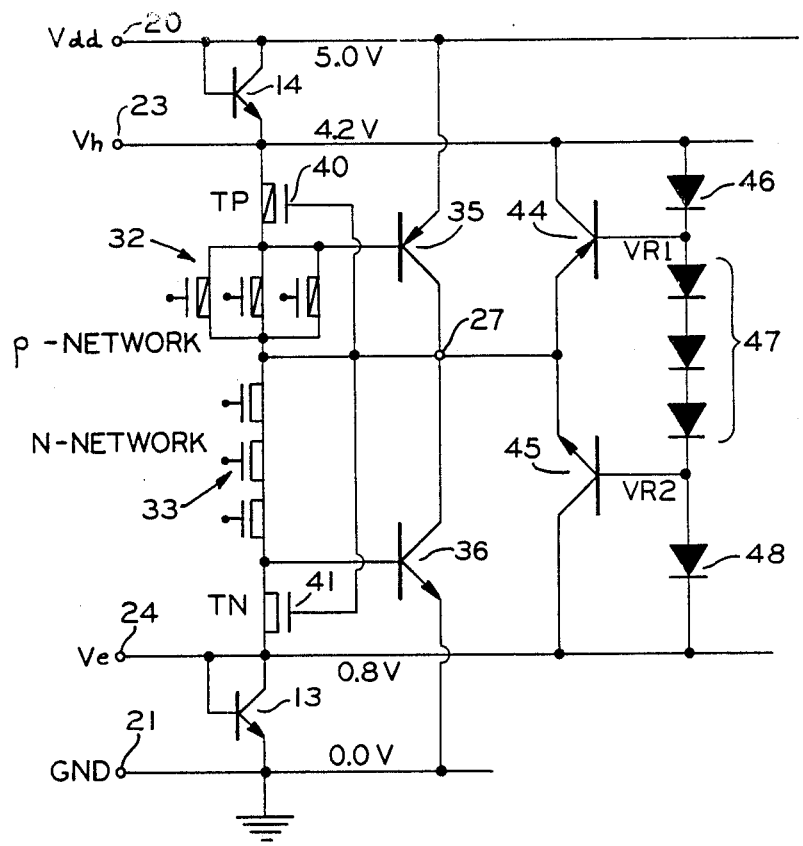
FIG_4
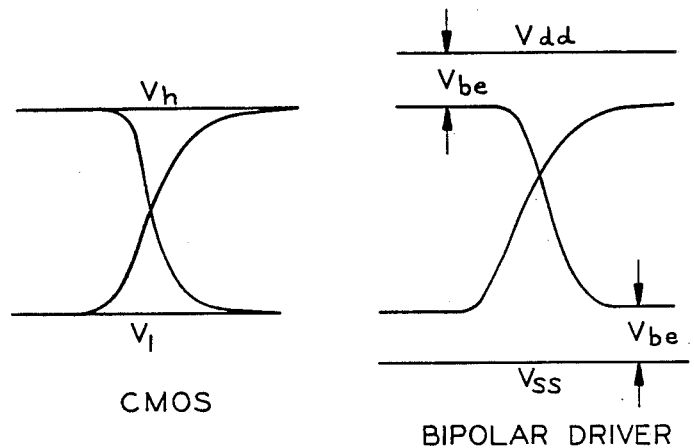
FIG_3

BICMOS DRIVER CIRCUIT FOR HIGH DENSITY CMOS LOGIC CIRCUITS

The present invention relates to high density metal oxide circuit technology. Specifically, a high speed bipolar CMOS driver circuit is provided having high noise immunity as well as a high load driving capacity.

CMOS circuit devices are used extensively in digital equipment. The systems employing CMOS circuits provide thousands of circuit functions on a given substrate area. The larger the system, the more substrate area is required.

In order to keep the cost of such systems to a minimum, it is necessary to keep the substrate surface area at a minimum. Increasing the circuit density, i.e., the number of circuit devices on the substrate, is therefore advantageous.

In CMOS technology, the speed of logical devices must be preserved as well as the noise immunity of the devices. Reducing the size of the channel length of CMOS transistors will require a lowering of the operating voltage, as well as a lowering of the threshold voltage $V_t$ for each field effect transistor. The lowering of the threshold voltage results in interface problems with circuits which are commonly used as driving circuits for CMOS circuitry. Such an interface circuit is shown in U.S. Pat. No. 3,879,619. These devices provide bipolar output transistors which are used to drive a CMOS load.

Specifically, the lower threshold voltage $V_t$ is approximately the same magnitude as the bipolar driving circuit output voltage at the low logic level Vbe, making it difficult to turn off the CMOS transistor. The CMOS circuitry exhibits less noise immunity as the threshold voltage $V_t$ approaches the driving voltage logic levels.

Attempting to use conventional BICMOS circuits with the reduced CMOS operating voltage further reduces the circuit overdrive. Typically, the BICMOS circuit will produce a high logic level which is Vbe volts, where Vbe is the base to emitter potential, below operating voltage, and a low logic level Vbe volts above ground. The reduced overdrive potential Vodn equals Vsupply-2Vbe, whereas the ideal overdrive is Vsupply-$V_t$, where $V_t$ may approach Vbe.

SUMMARY OF THE INVENTION

It is an object of this invention to provide a BICMOS driver circuit capable of driving high density CMOS logic circuits.

It is a more specific object of this invention to provide a CMOS/bipolar driving circuit which is capable of a voltage swing which does not degrade logic speed and noise immunity.

These and other objects of the invention are provided by a BICMOS driver circuit which is level shifted with respect to the following CMOS logic circuit operating potential. The BICMOS driver circuit generates a low logic level which is substantially below the threshold voltage $V_t$ of CMOS logic, and a high logic level which overdrives the CMOS logic at a level comparable with the CMOS logic overdrive parameters.

In carrying out the invention, a pair of complementary bipolar transistors are connected to a CMOS logic network. The transistors have serially connected collectors forming an output node, and emitters connected to opposite terminals of a bipolar voltage source. Two FET gating transistors connect the base of each transistor to opposite terminals of a CMOS logic circuit power source. The gate connections of the gating transistors are connected to the serially connected collectors of the transistors.

The CMOS logic networks will switch one or the other transistors on, producing an output node potential which is comparable to logic levels and full voltage swing derived from CMOS logic circuits.

BRIEF DESCRIPTION OF THE FIGURES

FIG. 1 illustrates a level shifted BICMOS driver circuit for driving a CMOS load 19.

FIG. 2 illustrates a preferred embodiment of the BICMOS driver 11 of FIG. 1.

FIG. 2A illustrates the operation of the BICMOS driver 11 in a pull-up mode.

FIG. 2B illustrates the operation of the BICMOS driver 11 in a pull-down mode.

FIG. 3 illustrates the bipolar output levels and CMOS output levels.

FIG. 4 illustrates the level shifted BICMOS circuit provided with a circuit for clamping output levels to CMOS logic levels.

DESCRIPTION OF THE PREFERRED EMBODIMENT

Referring now to FIG. 1, there is shown a BICMOS driver circuit 11 used for driving a CMOS logic circuit 19. BICMOS driver circuits 11 are used in BICMOS technology for driving larger capacitive loads presented by digital CMOS logic circuit 19. It is recognized that by using bipolar transistors as output driving circuits, the BICMOS driver circuits 11 will provide for increased load handling capacity.

The BICMOS driver circuit 11 is shown in a CMOS level shifted configuration. The CMOS logic 12 and 19 operating voltage Vh, Vl, provided on terminals 23 and 24, is at a lower potential than the BICMOS driver 11 operating voltage on terminals 20 and 21, Vdd and ground. The BICMOS driver circuit potential Vdd and ground permit the BICMOS driver output 27 to achieve the full voltage swing of a CMOS logic circuit. The low logic level provided by CMOS driver 11 will be sufficiently below the CMOS logic threshold voltage level $V_t$ to provide adequate noise immunity.

The CMOS voltage supply Vh, Vl provided by two transistors 13 and 14 is shown as NPN transistors in the diode connection mode where the base and collector are connected together. These transistors will provide approximately 0.8 volts drop from the voltage supply Vdd, and 0.8 volts above ground appearing on terminals 20 and 21. The transistors 13 and 14 effectively serve as voltage regulators for the CMOS operating voltage.

The CMOS circuits 12 and 19 are shown to be ground shifted. The potential Vl is 0.8 volts above ground, and the potential Vh 0.8 volts below Vdd. Thus, as was noted earlier, higher density CMOS circuits 12 and 19 can be operated using a lower operating voltage potential in order to maintain reliability.

The particular BICMOS driver circuit 11 shown in FIG. 2 provides a full output voltage swing and a low logic level sufficient to maintain the noise immunity obtained with the higher density CMOS logic circuit.

Referring now to FIG. 2, there is shown two transistors 35 and 36 which are complementary bipolar transistors. The collectors are connected together to form an output node 27. Each of the emitters are connected to opposite terminals 20, 21 of a bipolar voltage source. The PNP and NPN transistors 35 and 36 provide either a high level logic level or the low logic level on node 27.

Each of the bipolar transistors 35 and 36 are operated so that only one is on at a time. A CMOS logic network 30 receives a logic input on terminal 26 which may have multiple inputs to perform a NAND, AND or other logic function. The PFET network 32 and NFET network 33 will operate to turn one or the other of transistors 35 and 36 on, thus establishing one or the other bipolar output logic levels.

Transistors 13 and 14 are shown so as to establish the CMOS circuit operating voltage levels. To turn transistor 35 into a conducting mode, the PFET network 15 connects the base of transistor 35 to the collector of transistor 35. In this mode, current will be supplied from the bipolar voltage source Vdd so as to increase the potential on output node 27.

Referring to FIG. 2A, this pull up mode wherein PNP transistor 35 is rendered conductive in a gated diode mode, quickly charges the load capacitance 38 representing the following CMOS circuit input nodes which are highly capacitive to a potential which is proportional to the voltage drop across transistor 35 and the voltage source Vdd. During conduction of transistor 35 the normal load presented by a CMOS circuit 19 to the output node 27 produces a voltage drop of approximately 0.8 volts across transistor 35.

FIG. 2B illustrates the complementary pull down mode. In this condition, the output node 27 returns to the low logic level by virtue of an appropriate logic signal applied to input terminal 26. During this condition, the NFET network 33 connects the collector of transistor 36 to its base. The transistor will attempt to pull current from the load 38, returning the output node 27 potential to a voltage potential which is approximately 0.8 volts above Vss.

The shown circuit can, under heavy load conditions, generate output logic levels which exceed Vh and are below Vl. However, under normal operation, the voltage drop across transistors 35 and 36 will maintain the output logic levels at substantially the CMOS logic levels of Vh and Vl.

Transistors 35 and 36 operated as gated diode circuits are unique in providing a very fast switching time much faster than CMOS logic switching time. The voltage swing on the base of each of transistors 35 and 36 is only about 1 Vbe (base emitter voltage drop) between a completely switched condition and an unswitched condition. FET transistors 40 and 41 will maintain the base circuit of a connected transistor isolated when the other transistor is gated on. The base emitter potential is maintained at substantially Vbe volts as a result of the level shifting provided by transistors 13 and 14. This bias condition substantially improves the switching speed of the BICMOS device.

Referring now to FIG. 3, there is shown a comparison between the output of the bipolar driver circuit node voltage 27 and the normal CMOS input logic levels. By operating the BICMOS logic circuit at a higher operating 30 potential, approximately 2 Vbe greater than the operating potential for the CMOS logic circuit, the bipolar voltage swing is substantially the same as the CMOS logic level voltage swing. As was previously noted, the bipolar driver output voltage swing can even exceed the CMOS logic level voltage swing.

The foregoing circuitry becomes advantageous in higher density CMOS logic circuitry. In this circuitry, the voltage levels have to be reduced in order to reduce the potential damage to oxide layers and maintain circuit reliability. The CMOS logic circuitry, in higher density configurations, have a lower voltage threshold $V_t$ and an overall lower voltage overdrive Vodn. In order to preserve the noise immunity margins of CMOS circuitry, the BICMOS circuit driver must have a low logic level at least as low as the CMOS low logic level, and in overdrive Vodn at least as great as the CMOS logic provides. Therefore, with conventional BICMS logic circuits, the low logic level voltage which approaches the Vbe potential will reduce the noise immunity as Vbe approaches $V_t$.

As was seen with respect to FIG. 3, the lower logic level of the BICMOS output node can be as low or lower than the lower logic level provided in CMOS logic levels. This maintains the noise immunity of the circuit. Additionally, voltage overdrive can be maintained within CMOS standards.

Referring to FIG. 4, there is shown a BICMOS logic circuit having an output voltage clamp. Since excessive CMOS loads on output node 27 can result in full saturation of transistors 35 and 36, the corresponding output logic levels can go higher than the CMOS logic level specification. In order to limit the logic level voltage of node 27 to the $V_h$ and $V_1$, transistors 44 and 45 are provided. Each of these transistors includes a voltage reference circuit comprising diodes 46, 47 and 48. A reference voltage $VR_1$ and $VR_2$ is set for each transistor 44 and 45 to clamp the emitter potential of each of these transistors to $V_h$ and $V_1$. Thus, if the output voltage at node C attempts to rise above $V_h$, transistor 44 will be rendered conducting, clamping the output voltage node 27 at $V_h$. If the node C output voltage attempts to go below $V_1$, transistor 45 will clamp the output node voltage at $V_1$. These additional steps of providing clamping transistors 44 and 45 are only necessary where excessive CMOS loads are expected. Normally, Q1 and Q2 are not so saturated as to permit the node voltage 27 to exceed the CMOS logic levels.

Thus, there has been described two embodiments which include a BICMOS logic circuit which is particularly adaptable to high density CMOS logic circuits. The reduced operating voltage and logic levels of the high density CMOS logic circuits are accommodated with a level shifted BICMOS logic circuit so as to maintain CMOS logic speed and noise immunity. Those skilled in the art will recognize yet other embodiments described more particularly by the claims which follow.

What is claimed is:

1. A BICMOS device for supplying bipolar logic signals to high density low threshold CMOS logic devices comprising:

a complementary pair of bipolar transistors having collector circuits serially connected together to form an output node, and emitter circuits connected to respective terminals of a source of DC potential;

first and second voltage regulators connected to first and second terminals, respectively, of said source of DC potential;

first and second FET transistors connecting remaining respective ends of said first and second voltage regulators to a base connection of one of said bipolar transistors and each having gate connections connected to said collector circuit;

a PFET logic network connecting a base of one of said bipolar transistors to said connected collector circuits; and, an NFET logic network connecting a base of a remaining of said transistors to said connected collector circuits;

said logic networks controlling said complementary transistors such that one or the other is conducting depending on the state of said logic networks, whereby said connected collector circuits provide a voltage swing equal to the difference between the voltage provided by remaining ends of said voltage regulators.

2. The BICMOS device of claim 1 wherein said PFET and NFET logic networks form a NAND gate.

3. The BICMOS device of claim 1 wherein said voltage regulators are bipolar transistors having a base and collector connected to each other, serially connecting said source terminals to said first and second FET transistors.

4. The BICMOS device of claim 1 wherein said regulator have a voltage drop which produces a voltage difference equal to said CMOS logic device operating voltage.

5. A BICMOS device for supplying bipolar logic signals to a high density CMOS device comprising:

complementary bipolar transistors, said transistors having commonly connected collector circuits forming an output node and emitter connected to a bipolar transistor voltage source;

first and second FET transistors connecting a base of each of said complementary bipolar transistors to first and second terminals of a CMOS operating voltage source, and having a gate connection connected to said series connected collector circuits; and, a CMOS logic network connected to each base of said complementary bipolar transistors and to said series connected collectors, said logic network connecting the base and collector of one of said bipolar transistors together, whereby said series connected collectors produce a voltage swing equivalent to the CMOS voltage source potential.

6. The BICMOS device of claim 5 wherein said CMOS logic circuit comprises a complementary PFET and NFET network.

7. The BICMOS device of claim 5 wherein said CMOS operating voltage source is derived from first and second regulators serially connecting said first and second FET transistors to said bipolar transistor voltage source.

8. The BICMOS device of claim 7 wherein said first and second regulators are bipolar transistors having a base connected to a collector.

9. The BICMOS device of claim 1 or 5 further comprising a voltage clamping circuit for limiting the voltage produced by said output node to the voltage potential of said first and second terminals of said CMOS operating voltage source.

* * * * *

UNITED STATES PATENT AND TRADEMARK OFFICE
CERTIFICATE OF CORRECTION

PATENT NO. : 4,897,564

DATED : January 30, 1990

INVENTOR(S) : Chih-Liang Chen

It is certified that error appears in the above-identified patent and that said Letters Patent is hereby corrected as shown below:

In column 4, at line 12, change "BICMS" to --BICMOS--.

Signed and Sealed this

Twenty-first Day of April, 1992

*Attest:*

HARRY F. MANBECK, JR.

*Attesting Officer*          *Commissioner of Patents and Trademarks*